(12) United States Patent
Chen et al.

(10) Patent No.: US 7,595,237 B2
(45) Date of Patent: Sep. 29, 2009

(54) NON-VOLATILE MEMORY CELL WITH A HYBRID ACCESS TRANSISTOR

(75) Inventors: Xiaoyu Chen, Singapore (SG); Donghua Liu, Singapore (SG); Sung Mun Jung, Singapore (SG); Swee Tuck Woo, Singapore (SG); Rachel Low, Singapore (SG); Louis Lim, Singapore (SG); Siow Lee Chwa, Singapore (SG)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 0 days.

(21) Appl. No.: 11/740,939

(22) Filed: Apr. 27, 2007

(65) Prior Publication Data

US 2008/0266944 A1    Oct. 30, 2008

(51) Int. Cl.
*H01L 21/336* (2006.01)

(52) U.S. Cl. .............. 438/258; 438/261; 257/E21.679

(58) Field of Classification Search .............. 438/211, 438/258, 261, 266, 954; 257/E21.679
See application file for complete search history.

(56) References Cited

U.S. PATENT DOCUMENTS

| 5,559,735 | A | 9/1996 | Ono et al. |
|---|---|---|---|
| 5,862,082 | A | 1/1999 | Dejenfelt et al. |
| 6,044,012 | A | 3/2000 | Rao et al. |
| 6,794,711 | B2 | 9/2004 | Kang et al. |
| 7,029,976 | B1 | 4/2006 | Nagarad et al. |
| 7,250,654 | B2 * | 7/2007 | Chen et al. ................. 438/216 |
| 2004/0207003 | A1 | 10/2004 | Kim et al. |

* cited by examiner

*Primary Examiner*—Chandra Chaudhari
(74) *Attorney, Agent, or Firm*—Horizon IP Pte Ltd (57) ABSTRACT

A non-volatile memory cell includes an access and a storage transistor coupled in series. The memory cell is formed on a thin gate well tailored for transistors with thin gate dielectrics. The access transistor is a hybrid transistor which includes a gate with a thick gate dielectric layer formed on the thin gate well.

21 Claims, 14 Drawing Sheets

NON-VOLATILE MEMORY CELL WITH A HYBRID ACCESS TRANSISTOR

FIELD OF THE INVENTION

The present invention relates generally to integrated circuits (ICs), and more particularly to non-volatile memory devices.

BACKGROUND OF THE INVENTION

Non-volatile memory devices are able to retain stored data even when the power supply is interrupted. Non-volatile memory devices comprise flash devices which can be programmed using electrical signals. For the memory device to be byte-operational, a 2T cell structure consisting of a memory transistor and a select or access transistor in series can be provided. The memory transistor stores data programmed into the memory cell, while the access transistor selects the memory cell to be programmed or erased.

The memory transistor can be of various types including, for example, floating gate type, metal-nitride-oxide-silicon (MNOS) type, silicon-nitride-oxide-silicon (SNOS) type, metal-oxide-nitride-oxide-silicon (MONOS) type, and silicon-oxide-nitride-oxide-silicon (SONOS) type. The SONOS type memory transistor has a stacked gate structure comprising a nitride layer sandwiched between lower and upper oxide layers, and a polysilicon gate layer. The lower oxide layer is a tunnel oxide layer, the nitride layer is a memory or storage layer, and the upper oxide layer is a blocking layer for preventing the loss of stored charge. The charge-trapping ability of the SONOS stack structure allows lower programming and erase voltages to be used. The SONOS memory transistor also comprises source and drain regions formed on either side of the stack structure.

Programming is typically by hot carrier injection. Programming speed depends on the efficiency of hot carrier generation which, in turn, depends on the programming current. Programming current is affected by various factors including, for example, channel doping level and gate width of the memory transistor. Erase can be by Fowler-Nordheim (F-N) tunneling.

Generally, it is desirable to provide a non-volatile memory device having high programming speed and small cell size to allow for high density memories.

SUMMARY OF THE INVENTION

The present invention relates generally to ICs. In particular, the present invention relates to non-volatile memory devices. In one aspect of the invention, an IC is provided. The IC comprises a thin gate well with channel doping tailored for transistors with thin gate dielectric layers and a non-volatile memory cell formed on the thin gate well. The non-volatile memory cell comprises an access transistor and a storage transistor. The access transistor comprises first, second diffusion regions and an access gate which includes a thick gate dielectric layer. The storage transistor which is coupled in series to the access transistor comprises first, second diffusion regions and a storage gate. The storage gate includes a storage layer.

In another aspect of the invention, a method of fabricating an integrated circuit is disclosed. The method comprises providing a substrate with a cell region defined thereon. The cell region is prepared with a thin gate well tailored for transistors with thin gate layers. A non-volatile memory cell having an access transistor and a storage transistor is formed in the cell region. The access transistor includes an access gate with a thick gate dielectric layer.

These and other objects, along with advantages and features of the present invention herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Various embodiments of the present invention are described with reference to the following drawings, in which.

DETAILED DESCRIPTION OF THE INVENTION

The present invention relates to non-volatile memory cells. More particularly, the present invention relates to a 2T flash type non-volatile memory device which increases programming speed while reducing cell size, enabling high density memories to be fabricated. The non-volatile memory cells can be incorporated into ICs and easily integrated into current CMOS processing technologies. The ICs can be any type of IC, for example non-volatile memories, signal processors, or system on chip devices. Other types of ICs are also useful. Such ICs are incorporated in, for example, microcontrollers, communication systems, consumer products such as cell phones and memory cards.

Figure 1:
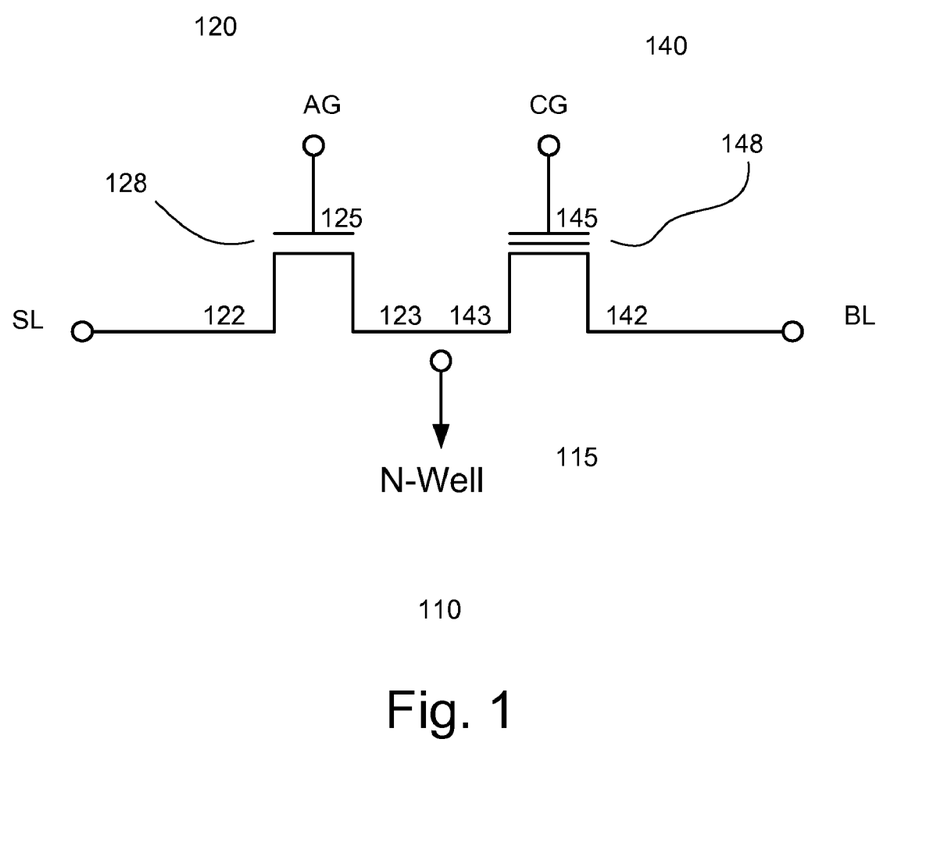
FIG. 1 shows a non-volatile memory cell in accordance with one embodiment of the invention.

FIG. 1 shows a non-volatile memory cell 110 in accordance with one embodiment of the invention. As shown, the memory cell comprises first and second series coupled transistors 120 and 140. The first transistor serves as an access transistor and the second transistor serves as a storage transistor. The transistors, in one embodiment, comprise transistors of a first polarity type. For example, the transistors comprise p-type transistors. N-type transistors are also useful. Alternatively, both n and p-type transistors are used. The first transistor includes a gate terminal 125 and first and second terminals 122 and 123; the second transistor includes a gate terminal 145 and first and second terminals 142 and 143. The gate terminal of the first transistor is coupled to an access gate line (AG) while the gate terminal of the second transistor is coupled to a control gate line (CG). The second terminals of the transistors are commonly coupled. Source and bit lines, SL and BL, are respectively coupled to the first terminals of the access and storage transistors.

In accordance with one embodiment of the invention, the access transistor comprises a hybrid transistor. The hybrid transistor includes a thick gate oxide 128 with a doped well 115 to accommodate a transistor with a thin gate oxide. The doped well comprises second polarity type dopants. For example, the doped well comprises a n-well for p-type transistors. As for the storage transistor, it includes a composite charge storing layer 148. In one embodiment, the composite charge storage layer comprises an oxide-nitride-oxide (ONO) stack. Other types of storage layers, such as nanocrystal embedded in oxide and oxide-metal(high-K)-oxide stack are also useful.

Figure 2:
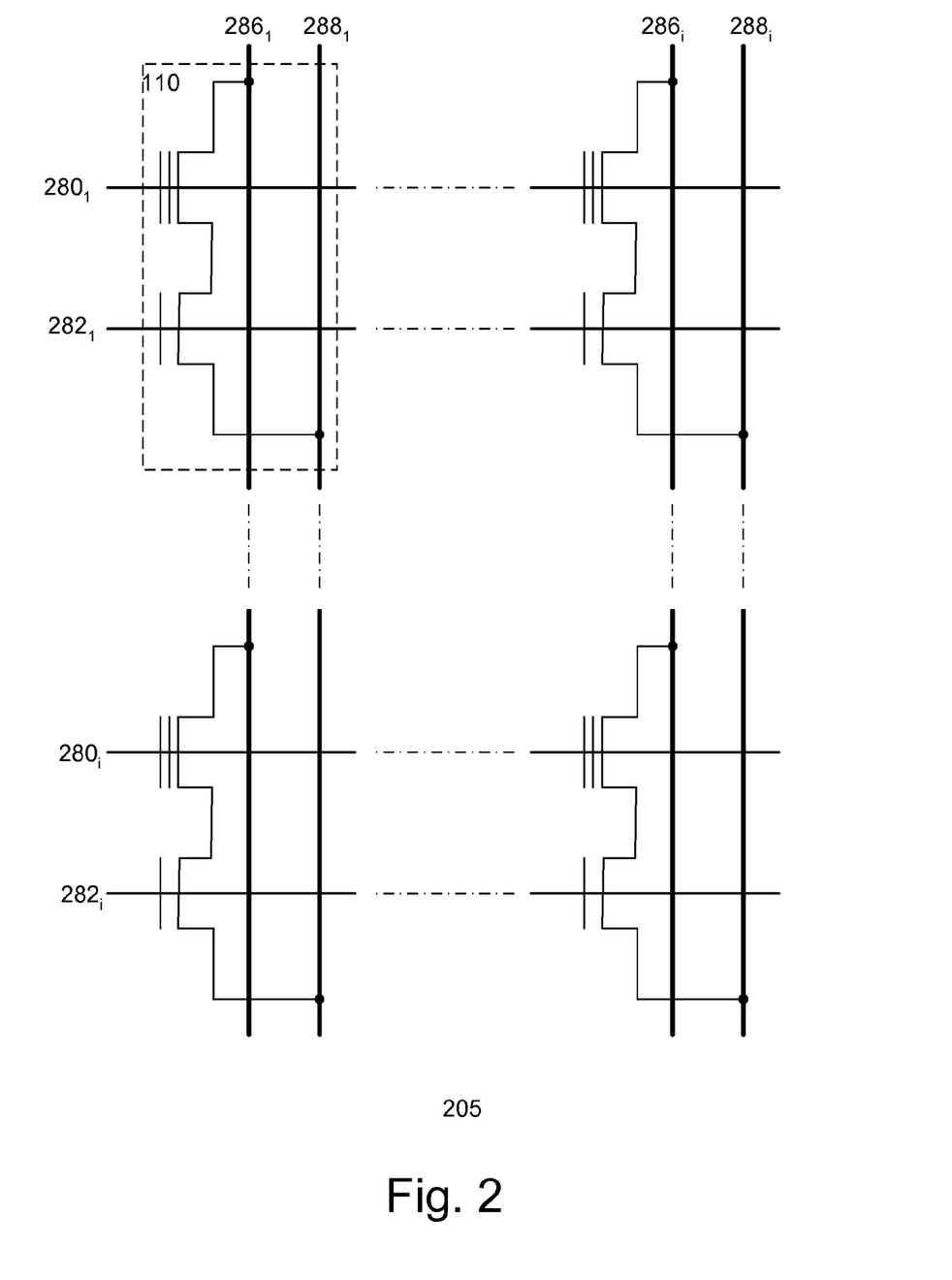
FIG. 2 shows a non-volatile memory array in accordance with one embodiment of the invention.

As shown in FIG. 2, a plurality of memory cells 110 can be provided to form a memory array 205. As shown, the memory cells are interconnected by control gate lines $280_{1-i}$, access gate lines $282_{1-i}$, bit lines $286_{1-i}$, and source lines $288_{1-i}$. Generally, the control and access gate lines are arranged in a first direction while the source and bit lines are arranged in a second direction. Other configurations are also useful. Logic circuitry (not shown) can be included to program and access the memory array.

Figure 3:
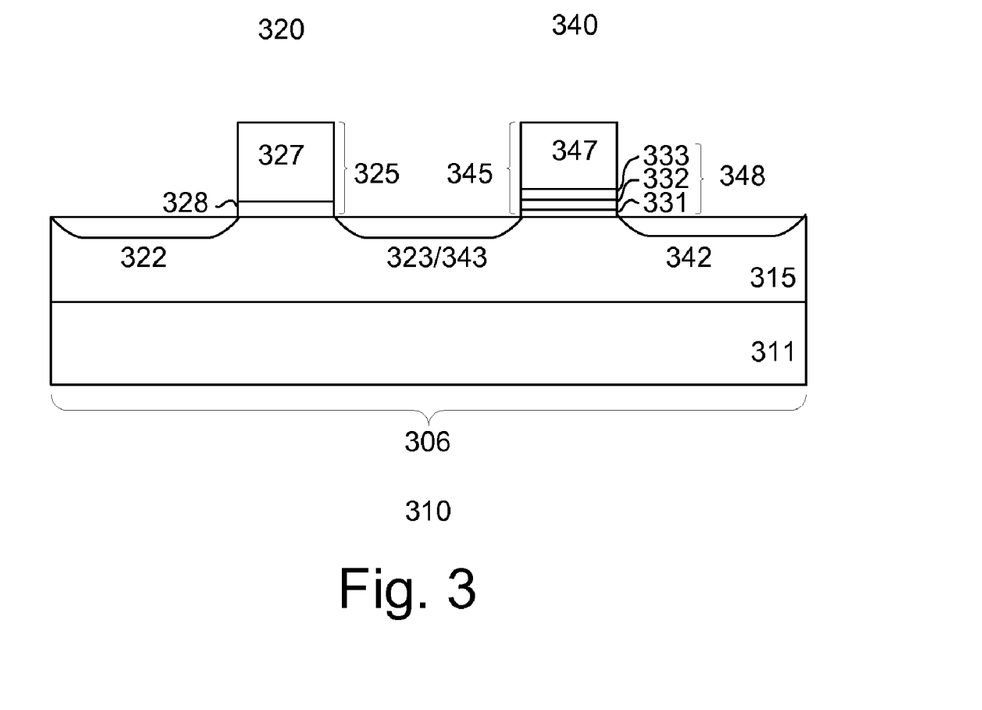
FIG. 3 shows a cross-sectional view of a non-volatile memory cell in accordance with one embodiment of the invention.

FIG. 3 shows a cross-sectional view of a memory cell 310 in accordance with one embodiment of the invention. The memory cell is formed on a substrate 311. The substrate, for example, comprises a lightly doped p-type silicon substrate. Other types of substrates are also useful. The substrate includes a cell region 306 for the memory cell. Isolation regions (not shown) are provided to isolate the cell region from other cells or devices. The isolation regions comprise, for example, shallow trench isolation regions. Other types of isolations are also useful. Typically, numerous cell regions are provided in an array region on a substrate. Logic devices, such as input/output (I/O) circuitry and control circuitry can be provided in a peripheral or logic region (not shown) on the substrate.

The cell region includes first and second transistors 320 and 340, with the first transistor serving as an access transistor and the second transistor serving as a storage transistor. The transistors, in one embodiment, comprise transistors of a first polarity type. In one embodiment, the transistors comprise p-type transistors. N-type transistors are also useful. Each transistor includes first and second diffusion regions (322, 323, 342, 343) adjacent to a gate stack (325, 345). The diffusion regions are formed by first polarity type dopants. Preferably, the transistors share a common second diffusion region 323/343. Contacts, such as silicide contacts, can be provided for the diffusion regions. A doped well 315 is provided beneath the substrate in the cell region. The doped well comprises a second polarity type doped well.

Disposed on the substrate in the cell region is the gate stack of the access transistor. The gate stack includes a gate layer 327 over a gate dielectric layer 328. The gate layer comprises, for example, polysilicon. As for the gate dielectric layer, it can comprise various types of dielectric materials. Preferably, the gate dielectric comprises thermal oxide. In one embodiment, the gate dielectric layer comprises a thick gate dielectric layer, with a physical thickness typically about 30-80 Å. Other thicknesses may also be useful. In accordance with one embodiment of the invention, the doped well on which the access transistor is formed comprises a doped well tailored for a transistor with a thin gate dielectric layer (thin gate well), providing a hybrid access transistor. The thin gate doped well, for example, comprises a dopant concentration of about $E^{17}$-$E^{19}$ cm$^{-3}$, and a depth of about 0.7-1.4 μm. Other concentrations and depths are also useful.

On the surface of the substrate in the cell region over the doped well is also disposed the gate stack of the storage transistor. Preferably both the access and storage transistors are formed in the same well. Forming the transistors in a common well region enables the memory cell to be reduced in size. The gate stack comprises a gate layer 347 over a storage dielectric layer 348. Typically, the gate layer comprises polysilicon. Other types of materials can also be used to form the gate layer.

In one embodiment, the storage layer comprises an oxide-nitride-oxide (ONO) trilayer, forming a SONOS gate stack structure. The ONO trilayer includes a lower (tunneling) oxide layer 331, an upper (blocking) oxide layer 333, and a nitride layer 332 sandwiched therebetween. Other dielectric materials capable of storing electrical charges may also be used. Additionally, the storage layer may comprise one, two or more layers. For example, a bilayer storage layer comprising a nitride layer and a tunneling oxide layer can be used. To facilitate tunneling and trapping of electrical charges for efficient programming and erasing of the non-volatile memory, the lower oxide layer is preferably about 24-45 Å physically thick, the nitride layer is preferably about 40-80 Å thick, and the upper oxide layer is preferably about 40-80 Å thick. More preferably, the lower oxide layer, nitride layer, and upper oxide layer are, respectively, about 35 Å, 45 Å and 45 Å thick. Other types of flash memories can also be used.

Although not shown, an interlevel dielectric layer is provided over the memory cell. Contacts are provided, coupling the diffusion regions and gate electrodes to source lines, bit lines, access gate lines and control gate lines.

As described, a non-volatile memory cell includes a hybrid access transistor with a thick gate dielectric layer formed on a thin gate well. Thin gate wells have higher channel doping compared to thick gate wells (wells tailored for transistors with thick gate dielectric layers), resulting in higher carrier generation efficiency. Furthermore, the thick gate dielectric layer of the hybrid access transistor allows higher bias voltages to be used. Higher bias voltages result in increased programming currents, which improve programming speed.

Preferably, the gate length of the storage transistor is reduced to increase tunneling current for higher programming speed. Furthermore, the gate length of the access transistor is reduced to be the thin gate channel length, resulting in smaller memory cell sizes. The gates, however, must be of sufficient length to prevent punch-through. Since immunity to punch-through increases with increased channel doping concentration, the use of thin gate wells allows transistors to have smaller gate lengths than thick gate wells. The gate lengths of the transistors, in a preferred embodiment, are selected to be at the minimum critical dimension (CD) for a specific process. More preferably, the minimum CD of each type of transistor is used. For example, for 0.18 μm technology, the gate length of the access transistor is about 0.18 μm while that of the storage transistor is about 0.17 μm.

The memory cell can operate in various modes, such as programming, reading and erase modes. The erase mode is initiated by applying appropriate bias conditions. In one embodiment, the erase mode is initiated by applying about 3.3 V to the gate of the access transistor, about 6 V to the thin gate n-well, and about −6.25 V to the gate of the storage transistor. Under such bias condition, data erasing is performed using a F-N tunneling current that flows through the tunneling oxide, drawing electrons from the ONO stack of the non-volatile memory transistor to the channel region. The bias voltage ($V_{gb}$) during erase, which is equal to the difference between the access transistor operating voltage and the n-well voltage, is about −2.7 V. Operation in this low $V_{gb}$ region avoids the problems of oxide breakdown, trap-up or transistor degradation associated with high electric field stressing.

The use of a thick gate oxide in the access transistor allows the access transistor to operate at 3.3 V. Conversely, if a thin gate oxide were used, the access transistor can only operate at a maximum of 1.8 V if gate oxide rupture is to be avoided. In such case, $V_{gb}$ is about −4.2 V in the erase mode since 6 V is applied to the thin gate n-well. Such a high bias voltage is liable to cause gate breakdown and reliability problems. Accordingly, the use of a hybrid access transistor is thus able to provide favorable bias conditions.

Figure 4:
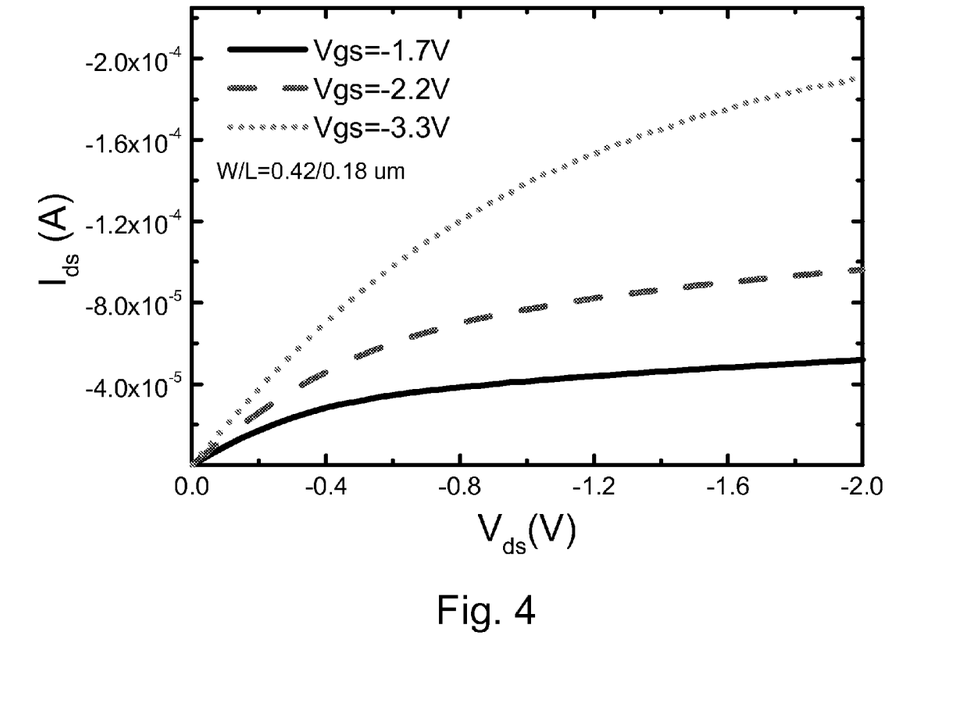
FIG. 4 shows gate voltage-drain current ($V_g$-$I_d$) curves of the hybrid access transistor according to one embodiment of the invention.

FIG. 4 shows measured gate voltage-drain current ($V_g$-$I_d$) curves of the hybrid access transistor according to one embodiment of the invention. The width, gate length, and gate oxide physical thickness of the transistor are 0.42 µm, 0.18 µm and 53 Å, respectively. $V_g$-$I_d$ curves at different thick gate bias voltage ($V_{gs}$) values are shown. As shown, the hybrid transistor works normally at a gate bias of −3.3 V, where 3.3 V is a standard I/O voltage for 0.18 µm 1.8/3.3 V dual gate process technology. Thus, the hybrid transistor can be used as a thick gate transistor even if the well beneath is a thin gate well and gate length is a thin gate channel length.

Figure 5A:
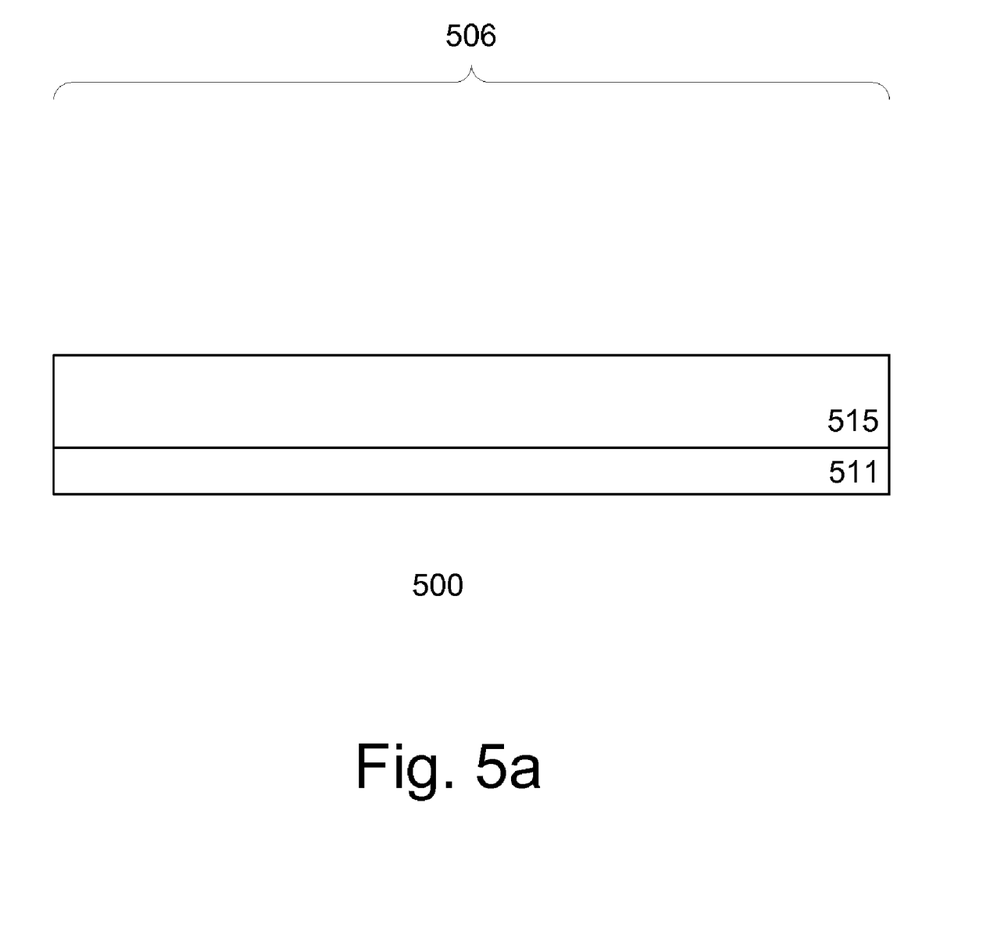
FIGS. 5a-j show a process flow for forming an IC in accordance with one embodiment of the invention.

FIGS. 5a-j illustrate an exemplary process flow for forming an IC 500 in accordance with one embodiment of the invention. Referring to FIG. 5a, a substrate 511 is provided. The substrate comprises a semiconductor substrate, such as silicon. Other types of semiconductor substrates, for example, SiGe, SiGeC, SiC, silicon-on-insulators (SOIs), SiGe-on-insulators (SGOIs), are also useful. In one embodiment, the substrate comprises a lightly doped p-type substrate. As shown, a cell region 506 is provided on the substrate on which a memory cell is formed. The cell region, for example, is a part of an array region with a plurality of cell regions on which memory cells are formed to create a memory array. Typically, the substrate also includes a logic region (not shown) on which logic circuitry is formed.

The substrate is prepared with a doped well 515 in the cell region. The doped well comprises dopants of the second polarity type. The second polarity type, for example, comprises n-type, forming a n-well. Alternatively, the second polarity type comprises p-type. In accordance with one embodiment of the invention, the doped well comprises a thin gate well having a channel doping concentration of about $E^{17}$-$E^{19}$ cm$^{-3}$. Conventional ion implantation techniques, such as implantation with a mask can be used to form the wells. Generally, the substrate includes first and second type wells in the logic region to form, for example, CMOS devices. Separate ion implantation processes are used for different types of wells. The doped well in the cell region can be formed along with the same type of wells in the logic regions. Threshold voltage (VT) implants are performed after well formation.

Isolation regions (not shown), such as STIs, are provided to isolate the cell region from other device regions. The STIs can be formed before or after the well is formed. In one embodiment, the STIs are formed before the wells are formed.

Figure 5B:
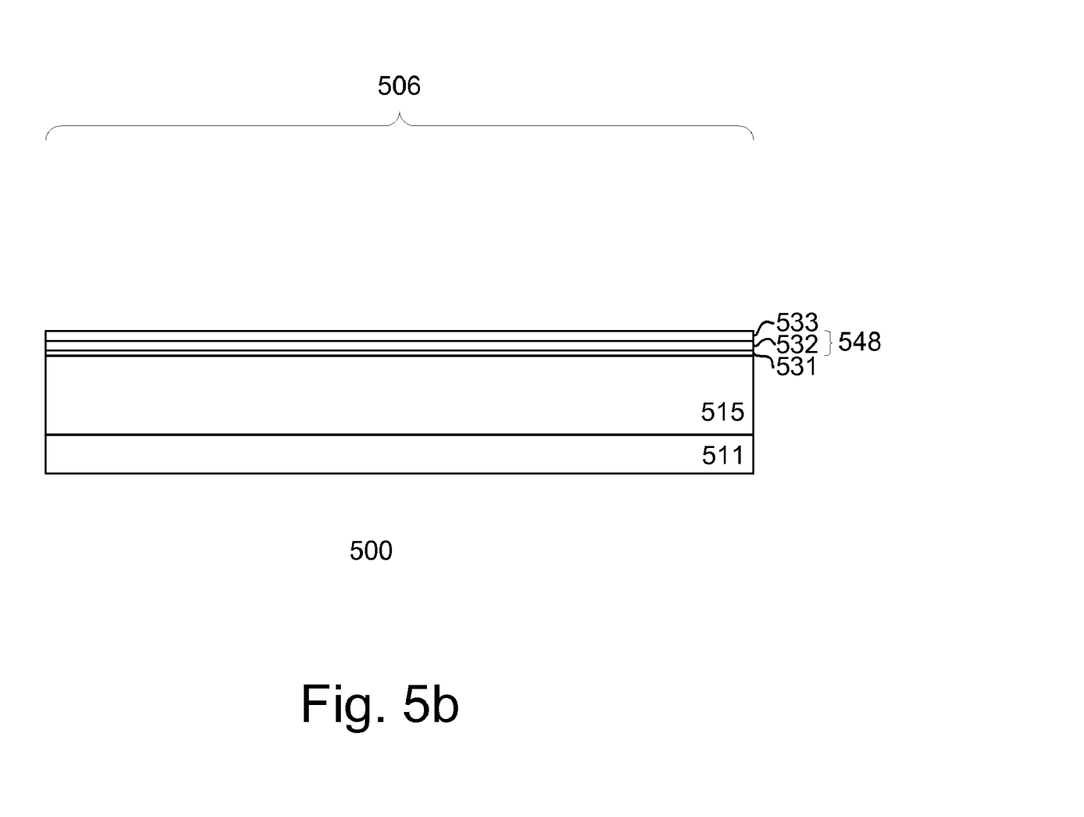

Referring to FIG. 5b, a storage layer is formed on the substrate surface. Typically, the storage layer is formed as a blanket layer on the substrate, covering both the array and logic regions. The storage layer, in one embodiment, comprises a composite layer stack. In one embodiment, the composite layer stack comprises an oxide-nitride-oxide (ONO) stack 548. Other types of storage layers are also useful. Conventional techniques can be used to form the ONO stack. In one embodiment, a tunneling oxide layer 531 is first formed. The tunneling oxide layer can be formed by, for example, rapid thermal oxidation (RTO). Other techniques including, for example, low pressure chemical vapor deposition (LPCVD) and thermal oxidation are also useful. The physical thickness of the tunneling oxide layer can be about 24-45 Å, and preferably about 35 Å. Next, a nitride layer 532 is deposited. The thickness of the nitride layer can be about 40-80 Å, and preferably about 45 Å. The nitride layer can be formed by LPCVD or nitridation. Other techniques are also useful. Finally, the top or barrier oxide layer 533 is formed. The thickness of the barrier oxide layer is about 40-80 Å, and preferably about 45 Å. The barrier oxide layer may be formed using the same techniques as for the tunneling oxide layer.

Figure 5C:
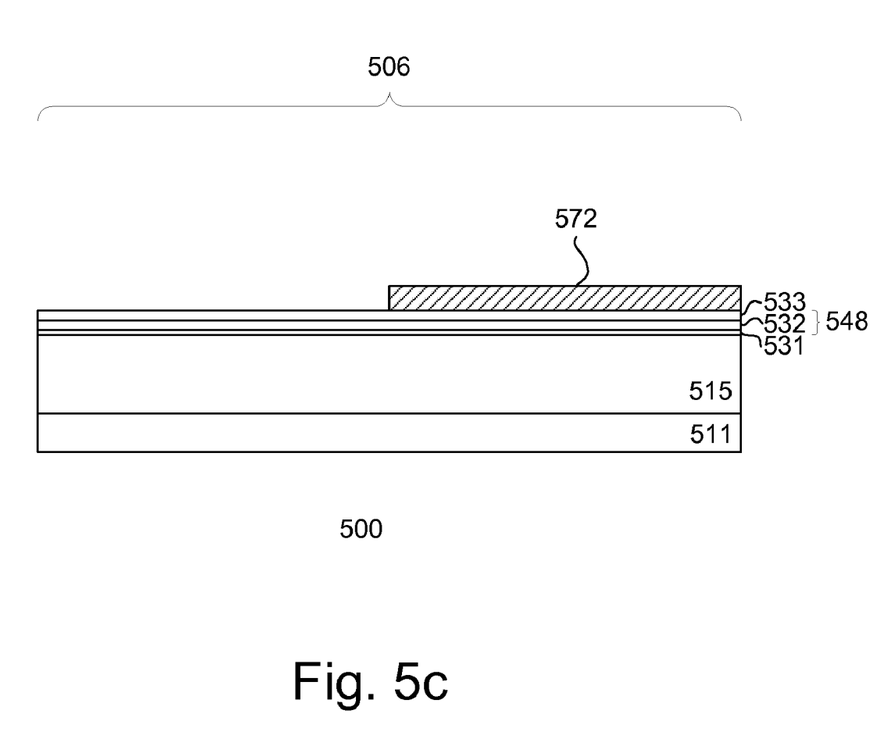
Figure 5D:
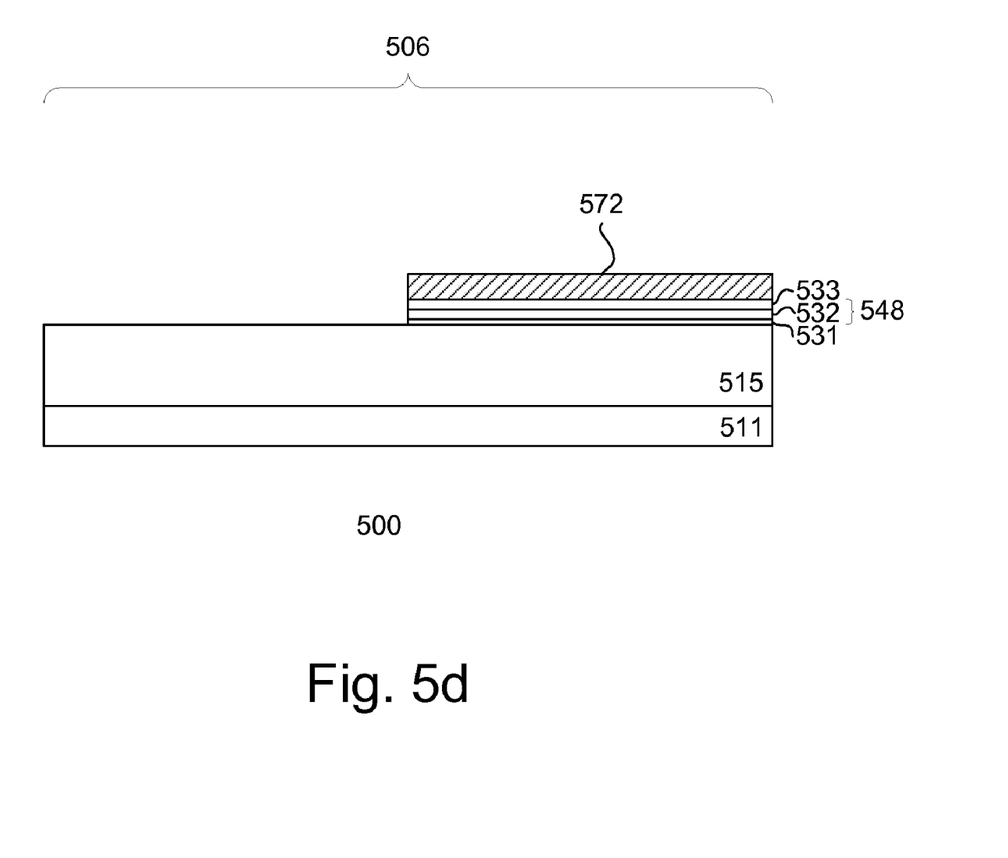
Figure 5E:
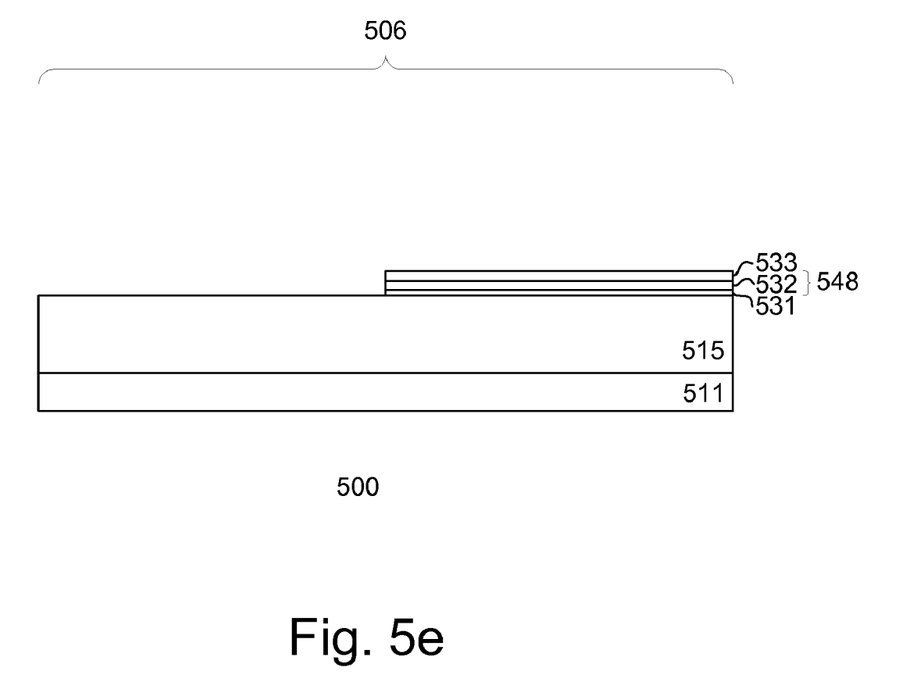

Referring to FIG. 5c, a photoresist layer 572 is deposited on the substrate. As is well known in the art, an anti-reflective coating (ARC) layer can be provided under the photoresist layer. For purposes of this discussion, reference to photoresist or resist can include an ARC layer. Furthermore, removal of the photoresist or resist can include removal of the ARC layer. However, it is understood that in certain applications, the ARC layer can remain when the photoresist is removed. The photoresist layer is patterned to expose portions of the storage layer which are to be removed. At least the portion of the storage layer in the cell region where the access transistor is formed is exposed. Additionally, portions of the storage layer in the logic region are also exposed. The exposed portions of the storage layer are removed, as shown in FIG. 5d. Removal can be achieved using, for example, an anisotropic etch such as reactive ion etch (RIE). The etch preferably is selective to the substrate. As shown in FIG. 5e, the photoresist layer is removed after etch.

Figure 5F:
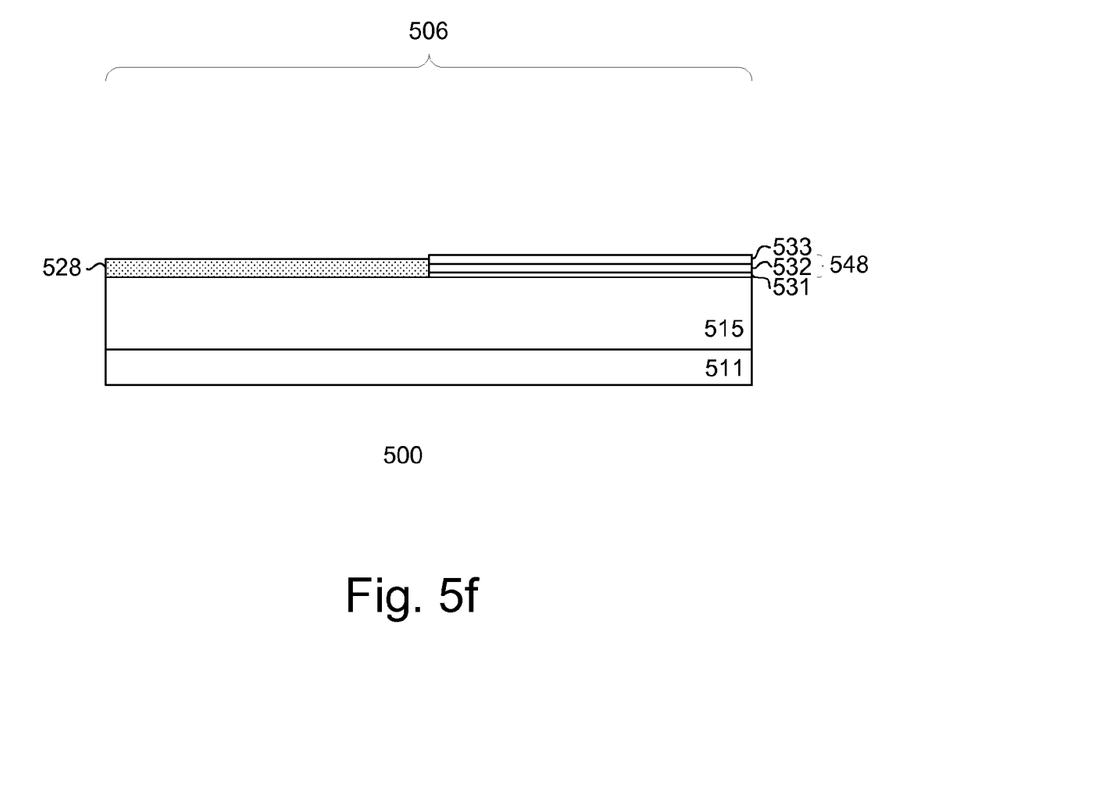

Referring to FIG. 5f, a thick gate dielectric layer 528 is formed on the substrate. The thick gate dielectric layer comprises, for example, silicon oxide. Other types of dielectric materials may also be useful. Preferably, the gate dielectric layer is formed by thermal oxidation or RTO. Thermal oxidation or RTO selectively forms the gate oxide on the exposed substrate. This is because in the storage transistor region, the thick gate oxide will not be formed since ONO trilayer serves as a hard mask. The physical thickness of the thick gate oxide is about 30-80 Å, and preferably about 46-60 Å. Other thicknesses may also be useful. Since the logic region is also exposed, the thick gate dielectric layer is also formed in the logic region.

In one embodiment, the array region is masked off for processing of the logic region. For example, portions of the storage layer in the logic region are removed, if applicable, and conventional dual gate processes are performed therein. For example, a thin gate dielectric layer is formed in the logic region. Since the array region is covered by mask layer during these processes, concerns about overlay or gate integrity issues are eliminated. Dual gate processes are described in, for example, U.S. Pat. No. 7,029,976, which is incorporated herein by reference.

Figure 5G:
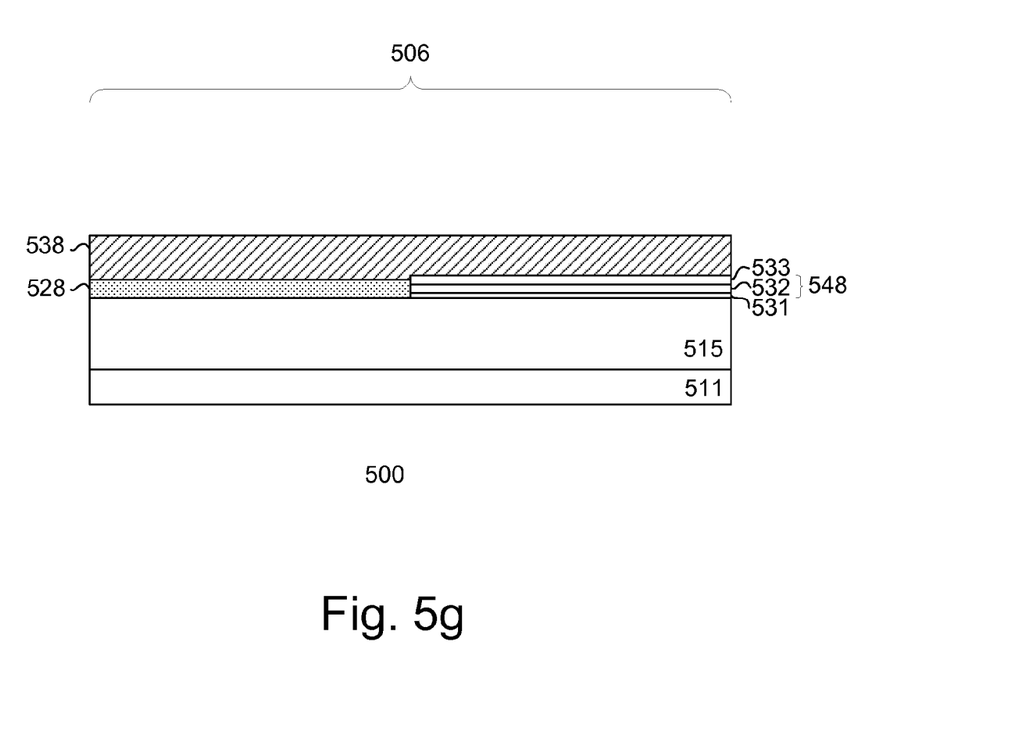

Referring to FIG. 5g, a gate layer 538 is formed on the substrate. The gate layer, for example, comprises a blanket gate layer on the substrate which covers both the array and logic regions. In one embodiment, the gate layer comprises a polysilicon gate layer. The polysilicon gate layer can be formed by chemical vapor deposition (CVD). The polysilicon layer may be doped to impart a higher conductivity to the gate. Other materials including, for example, metal or polycide, may also be used in the gate layer. The thickness of the polysilicon gate layer is, for example, about 1800-2200 Å.

Figure 5H:
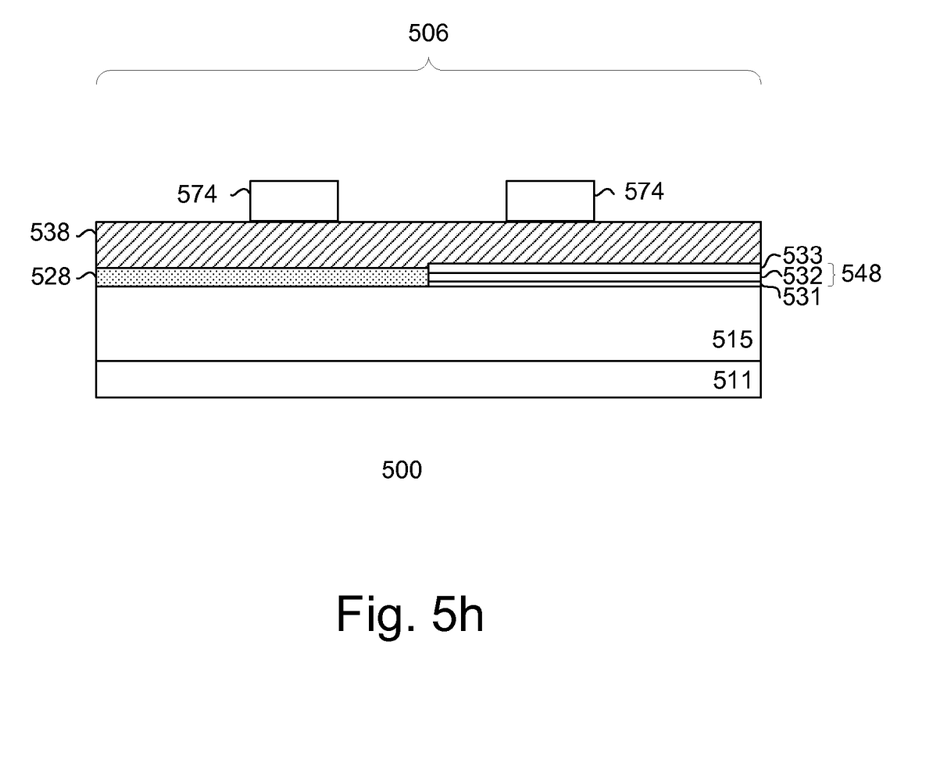
Figure 5I:
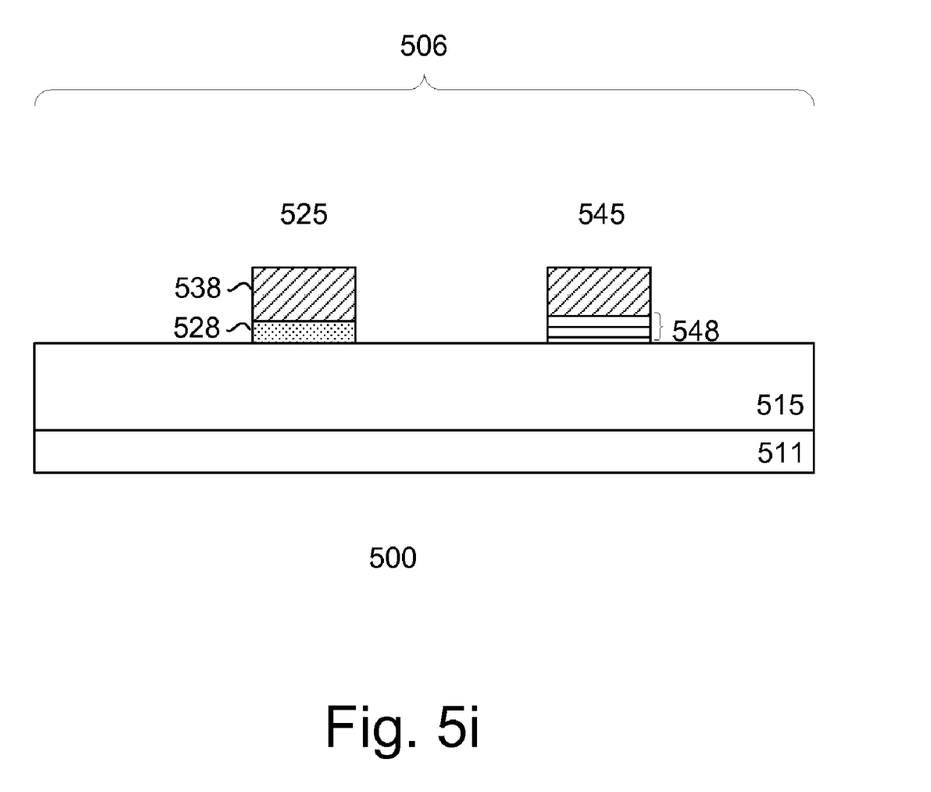

Referring to FIG. 5h, the polysilicon gate layer and the layers beneath it are patterned to form gate stacks of the access and storage transistors in the cell region. Gate stacks in the logic regions can also be patterned along with the gate stacks in the cell region. Conventional patterning techniques can be used to form the gate stacks. For example, a photoresist layer 574 is deposited on top of the polysilicon gate layer. The photoresist layer is patterned to expose portions of the polysilicon layer. The exposed polysilicon gate layer and the layers beneath it are removed to form the first and second gate stacks 525 and 545, as shown in FIG. 5i. Removal can be achieved using, for example, an anisotropic etch such as RIE. The etch is preferably selective to the substrate. The remaining portions of the photoresist layer on the top of the gate stacks are removed after etching.

Figure 5J:
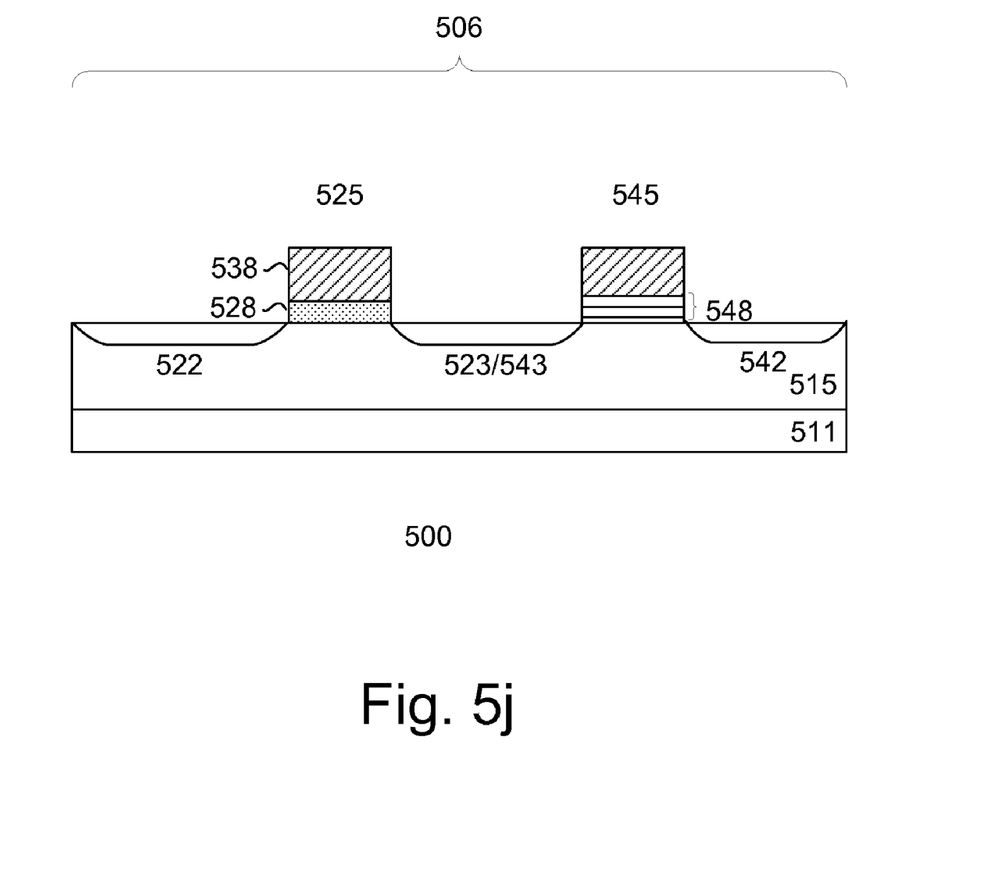

Referring to FIG. 5j, first and second diffusion regions (522, 523, 542, 543) of the first polarity type are formed on the substrate adjacent to the gate stacks, creating first polarity type transistors. The diffusion regions comprise doped regions in the well. The first polarity type, for example, comprises p-type, resulting in p-type diffusion regions in the n-well. In one embodiment, the transistors share a common second diffusion region 523/543 located between the gate stacks. The diffusion regions, for example, are formed using conventional techniques, such as ion implantation. Generally, first and second type diffusion regions are formed in the logic region. In one embodiment, the diffusion regions in the array region can be formed along with the first type diffusion regions in the logic region.

The process continues by forming interconnections to the diffusion regions and gates of the transistors. For example, the diffusion regions and gates are appropriately coupled to source lines, bit lines, access lines and control lines. Additionally, the thin gate well is coupled to a bias voltage. Appropriate interconnections are also formed in the logic region. Additional processes are performed to complete the IC. These processes include, for example, final passivation, dicing, and packaging.

As described, the memory cell of the present invention can be easily integrated into conventional CMOS processes. By forming and patterning the thick gate dielectric layer in the logic and cell regions concurrently, the additional gate steps are reduced or minimized. No additional implant processes are required to form the hybrid access transistors. By providing a memory cell design which facilitates simple circuit routing along with minimum CD gate lengths, cell size is reduced and density is increased. Furthermore, masking off the array region during dual gate processes eliminates overlay or gate integrity issues in the array region. In addition, the thick gate oxide of the access transistor allows for appropriate bias conditions to increase programming speed reliably. Therefore, the present invention provides a simple, reliable, high performing and low cost solution for integrating non-volatile memories in ICs.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of fabricating an integrated circuit (IC) comprising:
    providing a substrate with a cell region defined thereon, the cell region is prepared with a thin gate doped well tailored for transistors with thin gate dielectric layers; and
    forming a non-volatile memory cell in the cell region, the non-volatile memory cell having an access transistor and a storage transistor, wherein the access transistor includes an access gate with an access gate dielectric comprising a thick gate dielectric layer on the thin gate doped well, wherein wells for transistors with thick gate dielectric layers have a lower dopant concentration than the thin gate doped well.

2. The method of claim 1 wherein forming the storage transistor comprises:
    forming a storage gate in a storage portion of the cell region, the storage gate comprises a storage layer and a storage gate electrode over the storage layer; and
    forming first and second storage diffusion regions adjacent to the storage gate.

3. The method of claim 1 wherein forming the access transistor comprises:
    forming the access gate comprising the access gate dielectric and an access gate electrode over the thick gate dielectric layer; and
    forming first and second access diffusion regions adjacent to the access gate.

4. The method of claim 1 wherein forming the memory cell comprises:
    forming a storage layer in a storage portion of the cell region;
    forming the access gate dielectric in an access portion of the cell region; and
    forming a gate electrode layer over the storage layer and thick gate dielectric layer.

5. The method of claim 4 wherein forming the memory cell comprises patterning the layers over the cell region to form a storage gate and the access gate, wherein the storage gate comprises a gate electrode formed from the gate electrode layer over the storage layer and the access gate comprises an access gate electrode formed from the gate electrode layer over the access gate dielectric.

6. The method of claim 5 comprises forming first and second access diffusion regions adjacent to the access gate and first and second storage diffusion regions adjacent to the storage gate.

7. The method of claim 6 wherein one of the access diffusion regions is adjacent to the storage gate and one of the storage diffusion regions is adjacent to the access gate form a common diffusion region.

8. The method of claim 4 wherein forming the storage layer comprises forming a composite storage layer.

9. The method of claim 4 wherein forming the storage layer comprises forming a composite storage layer comprising an oxide-nitride-oxide stack.

10. The method of claim 1 wherein forming the memory cell comprises:
    forming a storage layer in the cell region;
    patterning the storage layer with a patterning mask to remove exposed portion of the storage layer from an access portion of the cell region;
    selectively forming the access gate dielectric in the access portion of the cell region; and
    depositing a gate electrode layer over the storage layer and access gate dielectric in the cell region.

11. The method of claim 10 wherein forming the storage layer comprises forming a composite storage layer.

12. The method of claim 10 wherein forming the storage layer comprises forming a composite storage layer comprising an oxide-nitride-oxide stack.

13. The method of claim 10 wherein selectively forming the gate dielectric comprises thermal oxidation.

14. The method of claim 10 comprises:
    patterning the layers over the cell region to form a storage gate and the access gate, wherein the storage gate comprises a gate electrode formed from the gate electrode layer over the storage layer and the access gate comprises an access gate electrode formed from the gate electrode layer over the access gate dielectric; and forming first and second access diffusion regions adjacent to the access gate and first and second storage diffusion regions adjacent to the storage gate.

15. The method of claim 14 wherein one of the access diffusion regions is adjacent to the storage gate and one of the storage diffusion regions is adjacent to the storage gate form a common diffusion region.

16. A method of forming a memory cell comprising:
providing a substrate with a cell region defined thereon, the cell region is prepared with a thin gate doped cell well tailored for thin gate dielectric transistors, the cell region comprises access and storage sub-regions;
forming a storage transistor in the storage sub-region, the storage transistor comprising a storage gate having a storage layer on the substrate and a storage gate electrode over the storage layer; and
forming an access transistor in the access sub-region on the thin gate doped cell well, the access transistor comprising a thick access gate dielectric on the substrate and a gate electrode on the thick access gate dielectric, wherein wells for transistors with thick gate dielectrics have a lower dopant concentration than the thin gate doped well.

17. A method of fabricating a semiconductor device comprising:
providing a substrate with an active region prepared with a doped cell well tailored for transistors with thin gate dielectric; and
forming a transistor in the active region on the thin gate doped well, wherein the transistor comprises a gate having a gate electrode over a thick gate dielectric, wherein wells for transistors with thick gate dielectrics have a lower dopant concentration than the thin gate doped well.

18. The method of claim 17 wherein:
the thin gate doped well comprises n-type dopants and the transistor comprises a p-type transistor; or
the thin gate doped well comprises p-type dopants and the transistor comprises a n-type transistor.

19. The method of claim 17 wherein the thin gate doped well comprises a dopant concentration of about E17-E19 $cm^{-3}$.

20. The method of claim 17 wherein:
the active region comprises a cell region of a memory cell; and
the memory cell comprises
an access transistor having an access gate electrode over a thick access gate dielectric, and
a storage transistor coupled to the access transistor, the storage transistor having a storage gate electrode over a storage gate dielectric.

21. The method of claim 20 wherein:
the storage gate dielectric comprises an ONO storage stack; and
the thick access gate dielectric is about 30-80 Å thick.

* * * * *